(12) United States Patent
Shei et al.

(10) Patent No.: US 9,740,529 B1
(45) Date of Patent: Aug. 22, 2017

(54) HIGH THROUGHPUT SYNCHRONOUS RESOURCE-CONSTRAINED SCHEDULING FOR MODEL-BASED DESIGN

(71) Applicant: The Mathworks, Inc., Natick, MA (US)

(72) Inventors: Chun-Yu Shei, Natick, MA (US); Girish Venkataramani, Boston, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 14/560,509

(22) Filed: Dec. 4, 2014

Related U.S. Application Data

(60) Provisional application No. 61/912,182, filed on Dec. 5, 2013.

(51) Int. Cl.
  *G06F 9/46* (2006.01)
  *G06F 9/50* (2006.01)

(52) U.S. Cl.
  CPC .................. *G06F 9/5027* (2013.01)

(58) Field of Classification Search
  CPC ............................................ G06F 9/46–9/5038
  See application file for complete search history.

(56) References Cited

U.S. PATENT DOCUMENTS

| | | | | |
|---|---|---|---|---|
| 4,972,314 A | * | 11/1990 | Getzinger | G06F 9/4436 711/149 |
| 5,574,912 A | * | 11/1996 | Hu | G06F 21/556 707/999.001 |
| 5,664,193 A | * | 9/1997 | Tirumalai | G06F 8/4452 712/241 |
| 5,867,711 A | * | 2/1999 | Subramanian | G06F 8/4452 717/156 |
| 6,016,399 A | | 1/2000 | Chang | |
| 6,651,247 B1 | * | 11/2003 | Srinivasan | G06F 8/4452 712/226 |
| 6,671,878 B1 | | 12/2003 | Bliss | |
| 7,123,970 B1 | * | 10/2006 | Stroomer | G06F 8/423 700/17 |
| 7,546,592 B2 | | 6/2009 | Martin | |

(Continued)

OTHER PUBLICATIONS

Bennour et al., "Lower Bounds on the Iteration Time and the Initiation Interval of Functional Pipelining and Loop Folding," Design Automation for Embedded Systems, vol. 1, pp. 333-355, 1996.

(Continued)

*Primary Examiner* — Tuan Q. Dam
*Assistant Examiner* — Zheng Wei
(74) *Attorney, Agent, or Firm* — Cesari & McKenna LLP; Omar W. Wadhwa

(57) ABSTRACT

A system and method for optimizing a system design that includes two or more components, where at least one component is to be implemented using a constrained resource. From an initial schedule, the resource having a longest span time between a start busy time slot and an end busy time slot is identified. The schedule for the other resources is then also extended to the span time. The resulting design can be made synchronous by inserting up-sampler and down-sampler function blocks before and after any strongly connected components.

28 Claims, 10 Drawing Sheets

(56) References Cited

U.S. PATENT DOCUMENTS

| | | | |
|---|---|---|---|
| 7,797,647 B2 * | 9/2010 | Hassoun | G06F 17/5045 716/104 |
| 7,797,691 B2 | 9/2010 | Cockx et al. | |
| 8,024,686 B2 | 9/2011 | Ispir et al. | |
| 8,234,647 B1 | 7/2012 | Chutinan et al. | |
| 8,255,911 B2 * | 8/2012 | Sakai | G06F 9/5033 712/215 |
| 8,352,505 B1 | 1/2013 | Venkataramani et al. | |
| 8,402,449 B1 | 3/2013 | Biswas et al. | |
| 8,566,804 B1 | 10/2013 | Carrick et al. | |
| 8,812,276 B2 | 8/2014 | Aldrich et al. | |
| 8,863,069 B1 | 10/2014 | Venkataramani et al. | |
| 8,972,943 B2 * | 3/2015 | Papakipos | G06F 9/5027 714/35 |
| 9,047,124 B2 * | 6/2015 | Mehta | G06F 9/5027 |
| 9,336,057 B2 * | 5/2016 | He | G06F 9/5027 |
| 9,417,914 B2 * | 8/2016 | Ringseth | G06F 9/5027 |
| 2003/0188299 A1 * | 10/2003 | Broughton | G06F 8/427 717/141 |
| 2004/0073899 A1 * | 4/2004 | Luk | G06F 8/443 717/158 |
| 2005/0240924 A1 * | 10/2005 | Jones | G06F 9/5011 718/100 |
| 2006/0184470 A1 * | 8/2006 | Zhu | G06N 3/00 706/16 |
| 2007/0022424 A1 * | 1/2007 | Heirich | G06F 8/445 718/102 |
| 2007/0168902 A1 * | 7/2007 | Ogawa | G06F 17/5045 716/103 |
| 2007/0299980 A1 * | 12/2007 | Amini | H04L 47/10 709/231 |
| 2008/0216077 A1 * | 9/2008 | Emani | G05B 19/41865 718/102 |
| 2009/0083751 A1 * | 3/2009 | Sakai | G06F 9/4881 718/105 |
| 2009/0328049 A1 * | 12/2009 | Tanaka | G06F 9/5027 718/102 |
| 2013/0117752 A1 * | 5/2013 | Li | G06F 9/5066 718/102 |
| 2013/0158692 A1 * | 6/2013 | Jensen | H04L 7/02 700/94 |
| 2014/0229221 A1 * | 8/2014 | Shih | G06Q 10/06313 705/7.23 |
| 2015/0082314 A1 * | 3/2015 | Suzuki | G06F 9/54 718/102 |
| 2015/0143378 A1 * | 5/2015 | Lee | G06F 9/5027 718/103 |
| 2016/0070600 A1 * | 3/2016 | David | G06F 9/4887 718/104 |

OTHER PUBLICATIONS

Saito et al., "ILP-based Scheduling for Asynchronous Circuits in Bundled-Data Implementation," IEICE Transactions on Fundamentals of Electronics, Communications and Computer Sciences vol. E90-A No. 12 pp. 2790-2799, Dec. 1, 2007.

P. Coussy and A. Morawiec (eds.), High-Level Synthesis, Chapter 13—Operation Scheduling: Algorithms and Applications by Gang Wang, Wenrui Gong and Ryan Kastner, pp. 231-255, Springer Science+Business Media B.V. 2008.

* cited by examiner

HIGH THROUGHPUT SYNCHRONOUS RESOURCE-CONSTRAINED SCHEDULING FOR MODEL-BASED DESIGN

CROSS REFERENCE TO RELATED APPLICATION(S)

This application claims the benefit of U.S. Provisional Application Ser. No. 61/912,182 filed Dec. 5, 2013 entitled "High Throughput Synchronous Resource-Constrained Scheduling for Model-Based Design", the entire contents of which are hereby incorporated by reference.

BACKGROUND

This patent application relates to electronics and data processing systems and more particularly to resource scheduling.

BRIEF DESCRIPTION OF THE DRAWINGS

The description below refers to the accompanying drawings, of which.

DETAILED DESCRIPTION OF ILLUSTRATIVE EMBODIMENTS

I. Introduction

Figure 1:
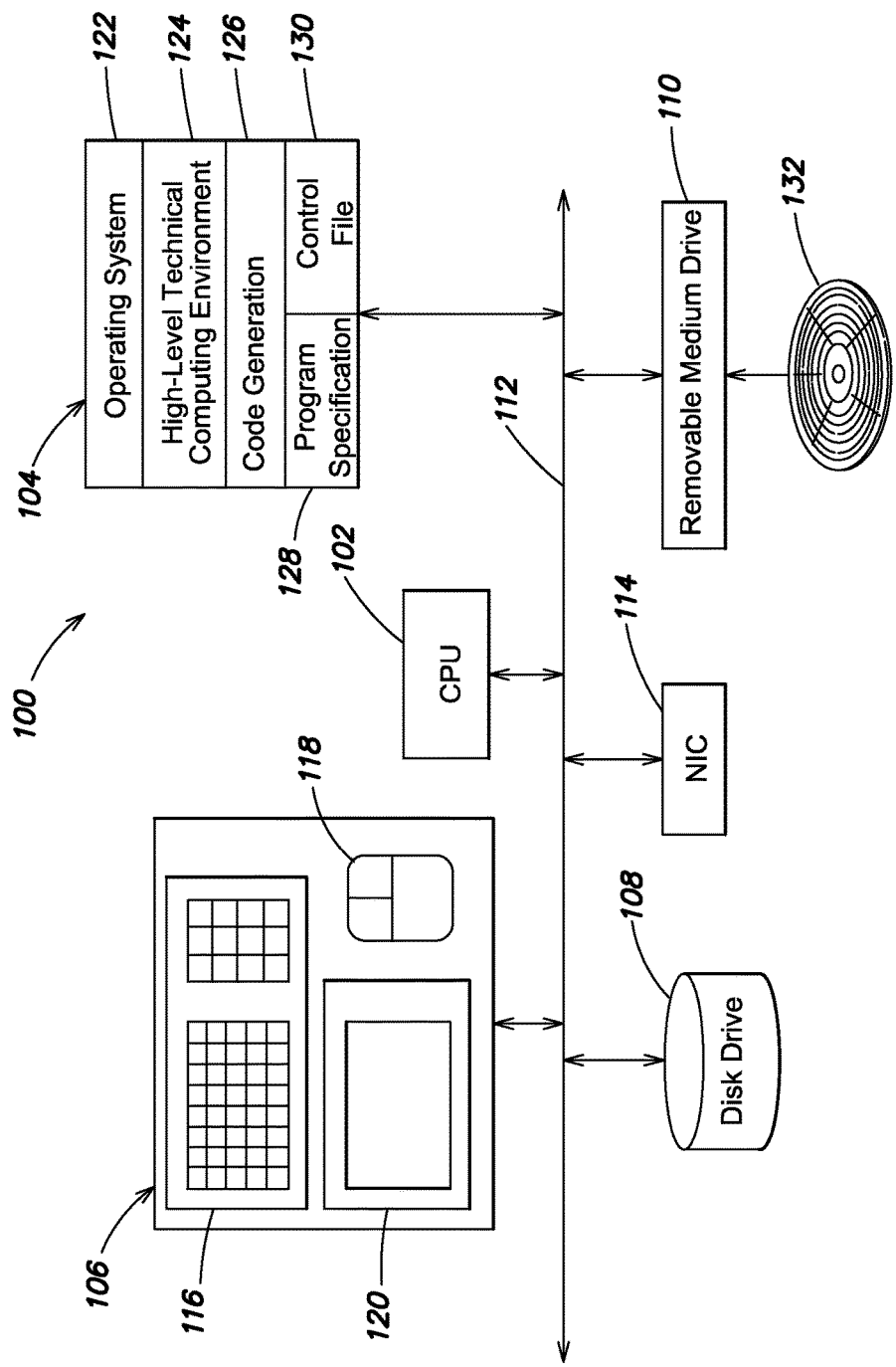
FIG. 1 illustrates an example data processing platform on which the present system and methods may be implemented.

There are many instances during the design of both electronic circuits and software programs that require the consideration of resource scheduling. The goal of resource scheduling is to assign available resources to available time slots according to a defined schedule. The schedule design may consider latency (that is the total length of the schedule) and throughput (how quickly the system can process a new set of inputs) as well as other considerations such as the number and cost of the necessary resources to implement the schedule, and/or other factors.

For an implementation where the available resources and/or execution time are essentially limitless, schedule design can be a relatively straightforward assignment of resources to a given task at any point in time. However, many practical schedule designs are resource constrained in some way. Schedule optimization in a resource constrained environment has proven a more difficult problem because of the inevitable contention for access to the constrained resource(s). Contention for access to a highly utilized resource such as a high speed computation unit or memory often results in tasks not being placed in optimal locations in the schedule. This leads to schedules that are longer than necessary or implementations that use more resources than are necessary.

Scheduling algorithms suitable for use in resource constrained environments therefore aim to produce a schedule consistent with certain objectives, such as finding a schedule with the shortest possible overall latency. If the designer also seeks to maximize throughput by traversing all possible assignments of resources to time slots, a solution can be difficult to find.

In addition to seeking reduced latency and maximized throughput, a scheduling solution can also recognize data dependencies and program order dependencies. For example, all data necessary for an operation may need to be read from a memory before an operation on that data can take place, and the operation must be complete before the result can be written back to the memory. It must also be considered that to minimize the number of resources consumed, a particular resource might also need to be reusable such that it executes one task at a first point in the schedule and is then used again for another task at a later point in the schedule. However, in other implementations, it may be desirable to minimize execution time by making multiple copies of a resource available in parallel at the same time.

A data flow graph representation of a design may be provided where software algorithms or circuit functions are described as directed graphs. Nodes in the graph represent computations, functions or subtasks, and edges in the graph represent data paths between nodes. However, data flow graph development is mainly concerned with the logical flow of data and not with the actual implementation of functions or execution timing.

For implementations where concurrent parallel execution is available, a task may be broken into subtasks which are then scheduled onto the parallel processors by manipulating the nodes and edges of the graph. Another use of data flow graphs is to determine how to best implement a loop. Heavy usage of a particular resource makes it difficult to freely place loop instructions that use that resource into a schedule without some organized approach to the design.

The process of scheduling thus generally comprises three steps: building a data dependency graph, ordering the nodes of the data dependency graph, and then scheduling the nodes to the available resources.

One such approach to providing data flow graphs was described in U.S. Pat. No. 8,402,449 by Partha Biswas et al., issued on Mar. 19, 2013 entitled "Auto Pipeline Insertion." That patent application explains how high-level development tools such as the MATLAB® and Simulink® technical computing environments available from the MathWorks®, Inc. of Natick Mass. may be used by a designer to create a graphical model by dragging and dropping functional blocks from a library browser into a graphical editor. The designer can then connect components of the model with lines that establish mathematical relationships and/or signals transmitted between the blocks. This patent also explains how a designer may set code generation options so that the model may be optimized for speed such as by implementing retimed pipelines, where multiple instructions or operations are overlapped in execution to increase throughput. This process involves executing a scheduling algorithm to produce a revision to the original graph by retiming the pipeline.

There are still other considerations when optimizing a design. For example, some implementations can accommodate asynchronous retiming, where the redesigned functional blocks may not all operate on the same clock cycle. However, in other applications, it may be desirable to retain synchronization between blocks.

In the approach described herein, a system and method is used for determining a resource-constrained schedule. In one implementation, the system and method begin with a representation of a design, such as a Hardware Description Language (HDL) code representation of a circuit, or such as a high level Intermediate Representation (IR) of a software program, generated from a program model created within a development environment.

The design representation may include a graphical model, a Stateflow® chart, MATLAB functions/files/scripts, Simulink blocks, etc. One or more graphs, such as a data flow graph (DFG), may be built based on the design representation. The DFG may include a plurality of interconnected nodes each set of such nodes corresponding to a component of the system.

A scheduler then uses a scheduling algorithm to produce an initial assignment of available resources to the nodes within each component at defined times. The schedule is then evaluated for possible optimization by first identifying any resource-constrained components, such that the resource is allocated to two different nodes in the graph at two different respective time slots. For each resource used by such a constrained component, the resource having the longest span between an initial busy time slot and a latest busy time slot is then identified. This "longest busy span" may then be used to determine a cycle time for the component. The schedule may then be modified to specify that other resources within the component, which might not otherwise have as long a busy time, are extended or retimed within the schedule to also match the cycle time for the component. These resources may be assigned to idle states during their extended time slots, such that they produce no effect at their outputs, even if their respective applied inputs change.

Synchronization between components may also be provided via local multi-rate sampling. Local multi-rate sampling can be provided, in one example implementation, by modifying the design to insert up-samplers at the input(s) of each such component, and inserting down-samplers to the output(s) of each such component.

In some implementations, only so-called strongly connected components may be submitted to rescheduling and/or retiming.

II. Example Implementation

More particularly now, FIG. 1 is a schematic illustration of an example computer system 100 for implementing and utilizing an embodiment of a system for producing code representing a resource-constrained design that uses resources that have been rescheduled to a specific cycle time per component and further optionally modified to include local multi-rate sampling.

The computer system 100 includes a central processing unit (CPU) 102, a main memory 104, user input/output (I/O) 106, a disk drive 108, and a removable medium drive 110 that are interconnected by a system bus 112. The computer system 100 may also include a network interface card (NIC) 114. The user I/O 106 includes a keyboard 116, a mouse 118 and a display 120.

The CPU may execute machine readable instructions to perform operations. The CPU may be replaced in whole or in part by other types of processors and/or logic elements, such as microprocessors, Field Programmable Gate Arrays (FPGAs), Application Specific Integrated Circuits (ASICs), embedded systems, or the like.

The main memory 104 stores a plurality of libraries or modules, such as an operating system 122, and one or more applications running on top of the operating system 122, including a technical computing environment 124. The main memory 104 may also include a code generation module 126. The code generation module 126 may be configured as a toolbox or an add-on product to the high-level technical computing environment 124. Furthermore, a user or developer may create and store a program specification 128 and a control file 130. The control file may be stored on disk or represented in the main memory 104.

The removable medium drive 110 is configured to accept and read a computer readable medium 132, such as a CD, DVD, floppy disk, solid state drive, tape, flash memory or other medium. The removable medium drive 110 may further be configured to write to the computer readable medium 130.

Suitable computer systems include personal computers (PCs), workstations, laptops, palm computers, smart phones, tablets, virtual machines, and other data processing devices, etc. Nonetheless, those skilled in the art will understand that the computer system 100 of FIG. 1 is meant for illustrative purposes only and that the present techniques may be used with other computer systems, processing systems or computational devices. The techniques may also be used in a networked, e.g., client-server, computer architecture, or in cloud-based environments.

Suitable operating systems 122 include the Windows® series of operating systems from Microsoft Corp. of Redmond, Wash., the Linux operating system, the MAC OS® series of operating systems from Apple Inc. of Cupertino, Calif., or the UNIX® series of operating systems, among others.

As indicated above, a user, such as an engineer, scientist, developer, designer, programmer, etc., may utilize the keyboard 116, the mouse 118 and the computer display 120 of the user I/O 106 to operate the high-level technical computing environment 124, and create the program specification 128 and the control file 130.

Suitable high-level technical computing environments may include the MATLAB® and SIMULINK® technical computing environments from The MathWorks, Inc. of Natick, Mass., the LabVIEW programming system from National Instruments Corp. of Austin, Tex., the Visual Engineering Environment (VEE) from Agilent Technologies, Inc. of Santa Clara, Calif., the Khoros development system now from AccuSoft Corp. of Northborough, Mass., the Modelica development system available from the Modelica Association, the SCADE design tool suite of Esterel Technologies SAS of Elancourt, France, a C programming system, a JAVA programming system, and a C++ is programming systems, other C environments, among others. Those skilled in the art will recognize that the computer system 100 need not include any software development environment at all.

Those skilled in the art will understand that the MATLAB® technical computing environment is a math-oriented, textual programming environment well-suited for digital signal processing (DSP) design, among other uses. The SIMULINK® technical computing environment is a graphical, block-based environment for modeling and simulating dynamic systems, among other uses.

Figure 2:
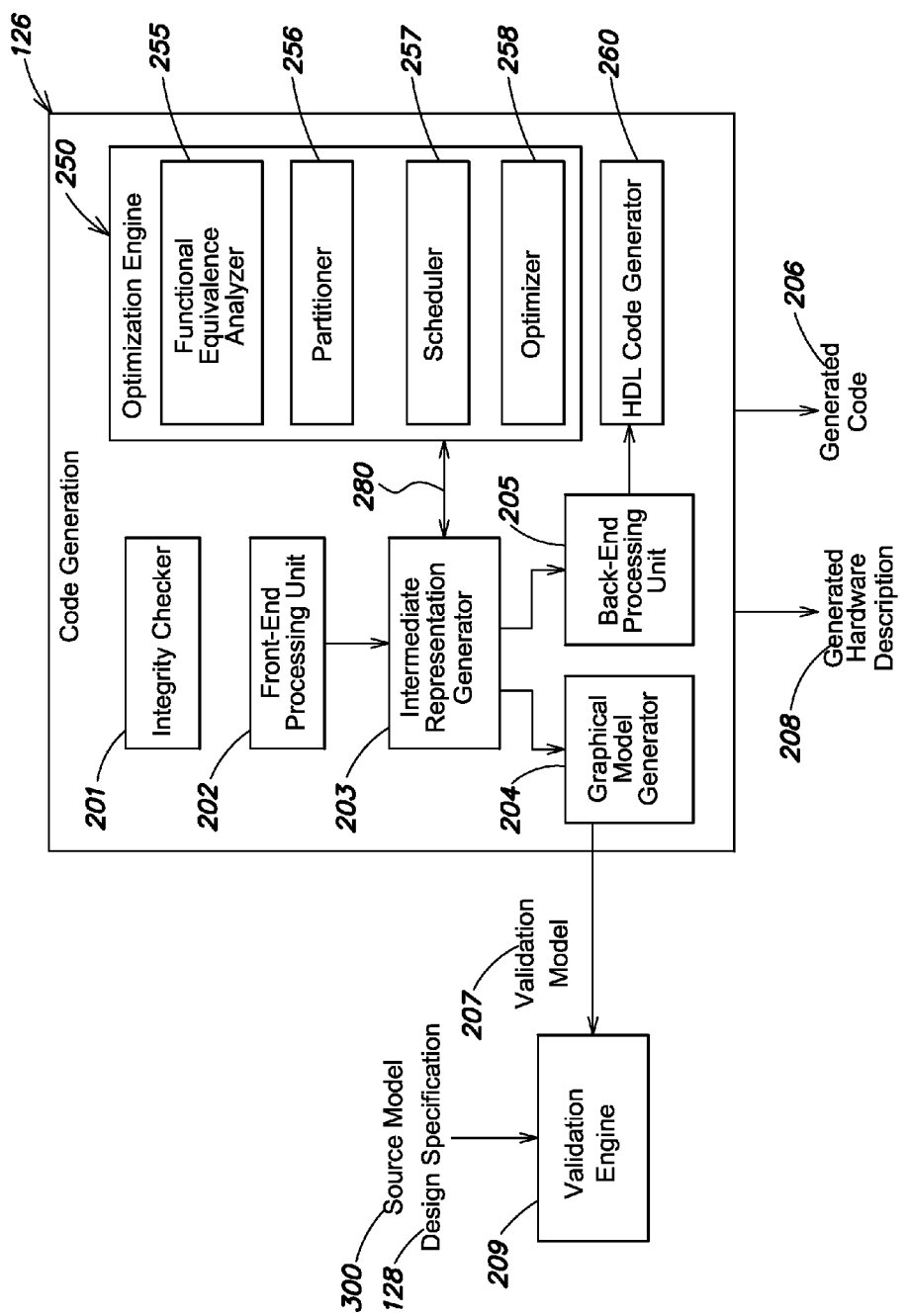
FIG. 2 illustrates an example code generation environment.

FIG. 2 is a highly schematic block diagram of the code generation module 126. The code generation module 126 may include an integrity checker 201, a front-end processing unit 202, an intermediate representation (IR) generator 203, a graphical model generator 204, back-end processing 205, and optimization engine 250. The code generation module 126 may receive design specification 128 created by the user within the technical computing environment 124. The design specification, which we will also refer to herein as the source model 300, may be a graphical model, a Simulink model, a block diagram model, a Stateflow chart, a textual code listing, a MATLAB file, etc. As described in more detail below, the code generation module 126 may produce hardware description language (HDL) code 208, such as VHDL or Verilog code, that is optimized, e.g., through the inclusion of one or more retimed schedules and the inclusion of one or more up-samplers and down-samplers, as more fully explained below. In alternative embodiments, the code generation module 126 may produce SystemC code or other program code 206 in any number of other languages to be run on a programmable data processor or digital signal processor. The code generation module 126 may also produce one or more annotated versions of the program specification 128 as a validation graphical model 207 to be used by an external design validation engine 209.

The code generation module 126 may include a plurality of components or modules. Specifically, the code generation module 126 may include an intermediate representation (IR) generator 203 that is configured to create one or more IRs from the source model 300. The code generation module 126 may further also include an optimization engine 250 that comprises a functional analyzer 255, a partitioner 256, a scheduler 257, an optimizer/insertion engine 258, and a Hardware Description Language (HDL) code generator 260. Each of these are discussed in more detail below.

The IR generator 203, functional analyzer 255, partitioner 256, scheduler 257, insertion engine 258 and the HDL code generator 260, may process and produce functional descriptions of a design as specified by the source model 300. In the illustrated embodiment, these are implemented as electronic circuits and/or software modules or libraries containing program instructions pertaining to the methods described herein. The software and program libraries may be stored on non-transitory computer readable media, such as computer readable medium 130, and executable by one or more processing elements, such as CPU 102. Other computer readable media may also be used to store and execute these program instructions. In alternative embodiments, various combinations of software and hardware, including firmware, may be utilized to implement the principles taught herein.

The code generation module 126 and/or the high-level technical computing environment 124 may include a user interface component that generates a user interface, such as a graphical user interface (GUI), for presentation to the user, e.g., on the display 120 of the computer system 100. The GUI may include one or more user interface controls through which the user can select or specify resource constrained options. Resource constrained options can also be specified as part of a subsystem model for which code generation is to be performed, and through which the user can initiate automatic code generation. Use of the resource constrained options in generating a schedule is described in more detail below.

The front-end processing unit 202 may perform a number of preliminary tasks, such as capturing data flow relationships specified in the source model 300, if any, determining block semantics, such as the type of block, determining particular block and/or subsystem parameter settings, as established by the user, etc. This information may be provided by the front-end processing unit 202 to the Intermediate Representation (IR) generator 203.

The IR generator 203 may generate an in-memory representation of the source model 300 or the designated subsystem. In an embodiment, the in-memory representation is in a form and structure that is suitable for use in generating hardware description code as well as returning the in-memory representation back into an executable graphical model. In an embodiment, the in-memory representation is in the form of a hierarchical, Data Flow Graph (DFG), referred to as Parallel Intermediate Representation (PIR), which has a plurality of nodes interconnected by edges. The nodes of the PR, also known as components, represent blocks from the source model or designated subsystem in an abstract manner, and the edges of the PIR, called signals, represent the connections between the blocks of the model or subsystem. Special nodes, called network instance components (NICs), provide hierarchy in the PIR, for example, by abstractly representing subsystems of the model. That is, each block of the source model 300 or subsystem may map to one or more nodes of the PIR, and each line or arrow of the source model 300 may map to one or more edges of the PR.

In the source model 300, signals representing data paths between the blocks may be continuously defined over a period of time based on values computed at points in time. For example, a signal value may be defined over an interval of time with a start time and a stop time by extrapolating the value of the signal computed at the start time. The extrapolation may be based on a zero-order hold. As another example, a signal value may be defined over an interval of time with a start time and a stop time by interpolating the value of the signal computed at the start time and the stop time. The interpolation may be based on a first-order hold.

In an embodiment, the in-memory representation of the source model 300 may have a plurality of hierarchically arranged levels. More specifically, the PIR may be a top-level of the in-memory representation of the source model 300, and one or more of the components of the PIR may be a particular type or form of in-memory representation. For example, one or more components of the PIR may be a Control Flow Graph (CFG), Control Data Flow Graph (CDFG), program structure tree (PST), abstract syntax tree (AST), etc. A CDFG may capture the control flow as well as the data flow of a graphical model through data dependency and control dependency edges. The in-memory representation or IR may be stored in memory, such as main memory 104 or in another storage device.

Figure 3:
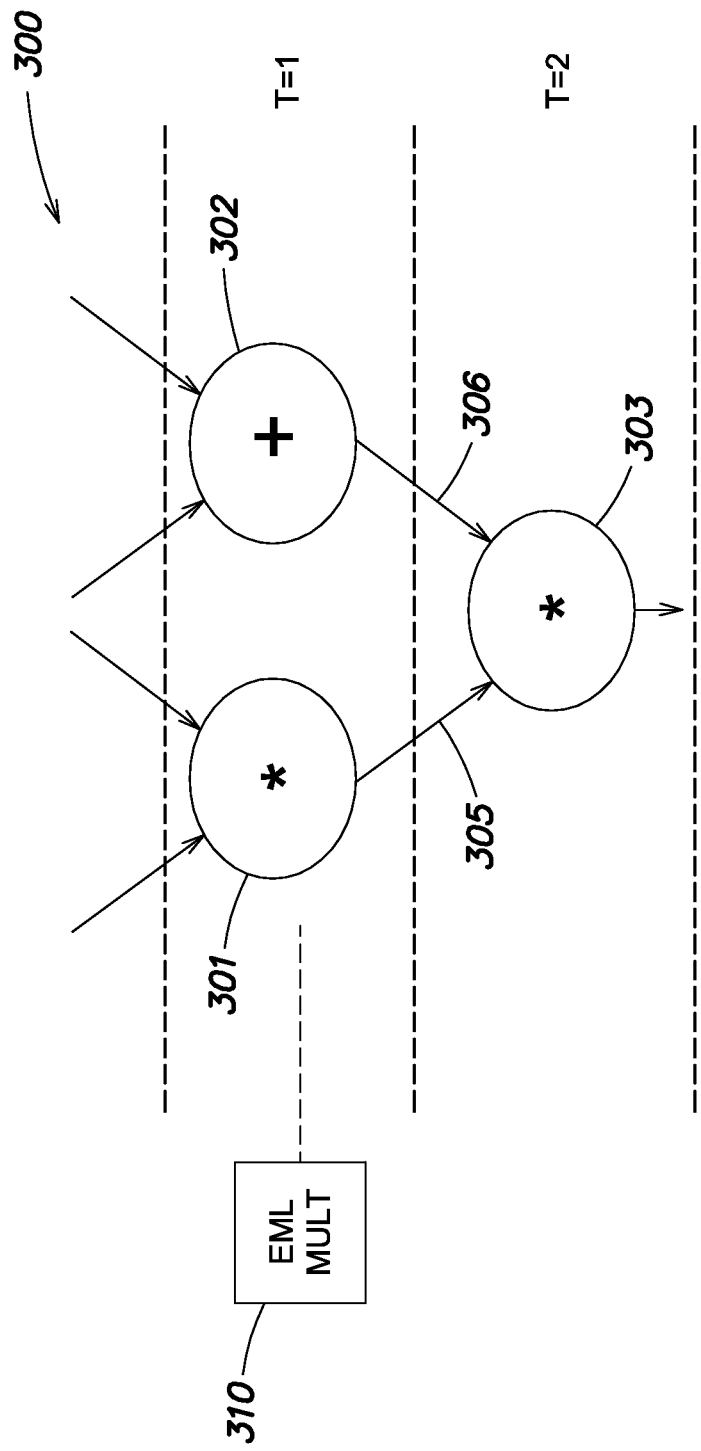
FIG. 3 is an example of a dataflow graph representation of a single component in a design.

FIG. 3 is a schematic illustration of an example source model 300. The example source model 300 here is of a system that provides a portion of a Finite Impulse Response (FIR) filter component. The FIR filter component includes a plurality of nodes interconnected with edges. As illustrated in FIG. 3, the source model 300 of the component may be a graphical model where the nodes are illustrated graphically by blocks 301, 302, 303 interconnected by edges illustrated as the arrows 305, 306. Specifically, the source model 300 has a first Product block 301, a second Product block 303, and an Add block 302 that each receive input data values. Source model 300 also has an output block 303 that outputs a value. The input and output values may be scalar values, a vector (such as representing a digital signal), a matrix of values, an array, multidimensional array, or other sets of values or value types.

The Add block 302 performs addition on its inputs, which may be scalar, vector, array, or matrix types. The Product blocks 301, 303 perform multiplication on their inputs. The blocks of the model 300 are interconnected by arrows 305, 306 that establish relationships among the blocks. The relationship represented by a given arrow may depend on the kind or type of model. More generally, in a time-based modeling system, an arrow may represent a mathematical relationship between two connected blocks where a first, e.g., upstream, block updates the signal, and a second, e.g., downstream, block reads the signal. In other modeling environments, the arrows or lines may represent data and/or control flow among the blocks.

A sequence of arrows that link a series of blocks, e.g., from an input to an output, may be referred to as a path, such as a signal path or data path. Different paths through the source model 300 may remain parallel to each other, or may merge at a join point of the model, such as merging at a particular block.

The source model 300 may execute over one or more steps. For example, the source model 300 may be a time-based model that executes over a plurality of time slots, or steps, from a start time to an end time. In this sample source model 300, there are just two time slots, T=1 and T=2. Alternatively, the source model 300 may be an event-based system, such as a state diagram, that executes over a plurality of event steps. In another embodiment, the source model 300 may be a data flow model in which case the one or more steps may be time or event based. An exemplary event in a dataflow model may be the availability of new data to be consumed.

In addition, the source model may specify available resources for implementation, which may place resource constraints on the schedule to be devised. Here, for example, if there is only one available multiplier resource to implement the Product blocks, then additional cycles may need to be included in the schedule. This will be discussed in greater detail below.

It should be understood that the source model 300 in FIG. 3 is an example intended for illustrative purposes only. Other models may be received for processing, such as models having different types or arrangements of blocks or representing different dynamic or other systems. For example, each block may correspond to a functional data processing element, such as a mathematical, logical, statistical, input/output (I/O) operation, filter, signal processing operation, programming construct, IF-THEN-ELSE, loops, etc. The source model 300 may also include one or more embedded code blocks (not shown). An embedded code block allows a user to incorporate textual code into a graphical model. A suitable example of an embedded code block is an Embedded MATLAB (EML) function block from The MathWorks Inc. The EML function block supports a subset of the functions provided by the MATLAB technical computing environment. Other code blocks can originate as Stateflow charts, or other known logic or high level program specifications. In one example, Product block 301 may be implemented by a specific EML function block such as a 16 bit multiply function.

Thus in general, the source model 300 and other models discussed in this document are meant for illustrative purposes only, and those skilled in the art will recognize that other, e.g., simpler, more complex, or other models, e.g., having different types or arrangements of blocks, etc., may be created by the developer. For example, in one embodiment, one or more of the graphical blocks may represent a subsystem, which itself comprises a plurality of interconnected blocks and/or subsystems.

In one example, the source model 300 may be a time-based model generated by the Simulink® graphical modeling system from The MathWorks, Inc. that executes or runs, e.g., iterates, over one or more time steps. In such a model a block of the source model 300 may execute once every time step. Alternatively, one or more blocks may execute once every occurrence of some multiple of the time step, such as once every third or fourth time step. Furthermore, the time step for a given block may be inferred from one or more other blocks of the model. For example, the time step for a given block may be indicated to be inherited, and an inferencing engine may determine the actual time step. The inferencing engine may be based on propagation, for example, when the output of a block with a time step indicated to be inherited is connected to the input of a block with a time step, the inherited sample time may be inferred to be that given time step. Other execution information such as data type, complexity, and dimensions may also be determined by an inferencing engine.

Furthermore, although the source model 300 is described here as being a graphical model, it should be understood that the model 300 can also originate in a text-based development environment.

III. Resource Constrained Rescheduling

Turning attention now more specifically to the scheduling of resources, the code generation module 126 (see FIG. 2) may evaluate the source model 300 to determine whether any resources are constrained. For example, a user may input an instruction to cause code generation module 126 to evaluate source model 300. The code generation module 126 may examine an in-memory representation of the source model 300, which may be produced by the IR generator 203, and determine the number of resources that would be required to implement the source model 300 in hardware according to prescribed parameters of the design. Such parameters, provided in one example via the user interface mentioned above, may impose constraints on the hardware resources used for implementation of the design, such as the number of, or maximum execution speed for, a particular resource. A hardware resource report may then be presented to the user, e.g., on the display 120 of the computer system 100, for further evaluation.

The scheduler 257 and/or optimizer 258 may then be enabled to generate one or more optimized hardware descriptions to be generated from the source model 300 and specified constraints. It should be understood that there are various ways to consider a model optimized in terms of what the optimization is with respect to. For example, the optimized version may use fewer resources, have a smaller memory footprint, or run faster than a model that has not been optimized. In an embodiment, these optimized hardware descriptions remain bit true and cycle accurate to the source model 300.

Scheduler 257 and the optimizer 258 may take an initial source model 300 as input and produce a revision that is optimized in some way given the constraints. The revision includes a schedule for resources needed to implement the model, including a revised schedule for one or more constrained resources. The optimizer 258 may also produce further revisions to the resources originally assigned by the scheduler 257. As will be understood from the discussion below, the techniques used herein can also support synchronism between components.

The optimization engine 250 can perform a task, beginning with a source model 300 such as MATLAB code, mapping components to the available physical resources according to a revised time schedule. For example, most any design implementation will have access to only a limited number of resources. Such resources will also have a limited number of input and output ports, and such resources will also require a certain finite amount of time to complete a task. On each time slot, a constrained resource can only operate on one set of inputs at a time, and its output is not valid until the end of one or more time slots. The component may therefore have to execute for a series of time slots to completely process the input to produce a valid output. For example, with only a single adder resource available to perform an M×N matrix addition, the implementation may require the scheduler 257 to specify executing over M×N cycles.

Furthermore, although the source model 300 may be specified as one component, it is common for there to also be multiple components in any given design. That is, one typically builds a system of multiple components interconnected with one another. The scheduler 257 and/or optimizer 258 therefore may also consider the collective execution of the components taken together as part of an overall optimized design. The optimizer 258 and/or scheduler 257 may also recognize data dependencies between the components, such that all data needed for an operation is read from memory before the operation commences, and such that the results are written back to memory before any subsequent operations need access to the results.

Data accesses may also need to be in program order so one must consider both data dependencies and program order dependencies, within each component. It is also possible in a system design that data flow between components also requires feedback loops and the like. Thus there are not only dependencies within each component, but also dependencies between components to be considered. The present approach to scheduler 257 and optimizer 258 thus considers these inter-component effects.

To better understand the example approach of scheduler 257 and optimizer 258, consider first the scheduling of a single component source model 300 such as was shown in FIG. 3. The task faced by scheduler 257 on the component level is, given a dependency graph, given a list of resources, and given resource constraints, to develop a schedule or map that assigns each node in the graph to an available resource for each time slot. This is a well-defined problem in computer science, and there are a number of different techniques that can be used by scheduler 257 to find an execution schedule and a mapping of nodes in the directed flow graph to available resources in the implementation model.

In one example of processing the model 300 shown in FIG. 3, the scheduler 257 can be informed that there is only one adder and one multiplier available as resources for the implementation model. Thus, because two multiply operations are needed, the single multiplier is resource-constrained and will have to be reused. The single multiplier is thus scheduled to perform a first operation in first cycle T=1 and perform the second multiply operation in the second cycle T=2. On the other hand, if there were two multiply resources available, everything might be executable in a single time slot (depending on data dependencies) and the schedule would be different.

To arrive at an initial solution to map the nodes in the model to available resources, the scheduler 257 may use any number of known scheduling algorithms. For example, using a simple algorithm, known as ready list scheduling (or simply "list scheduling"), an initial solution can be specified by the following pseudocode:

```
T=0
readyList.initialize( );
while (!readyList.empty( )
  foreach (s in readyList)
    if (checkDependencies(s)
        && checkResources(s))
      schedule (s, T);
      readyList.remove(s);
      readyList.populateDependencies(s);
    end
  end
  T++;
end
``` where T indicates a time slot, and s is a node in the graph that needs to be scheduled. The idea is to maintain a list of nodes in the graph that are available or "ready" to be scheduled. For each time slot, T, a list scheduler 257 process walks through the list of resources, and checks to make sure that all of its inputs and/or predecessor dependents (e.g., the corresponding input nodes in the graph) are already scheduled in a previous time step. If both conditions are true, the list scheduler 257 can schedule that node to the current time slot and remove it from the list. The list scheduler algorithm then populates dependents of that node (e.g., its corresponding output nodes). These steps are then repeated for each statement in the ready list until all conditions are satisfied.

Figure 4:
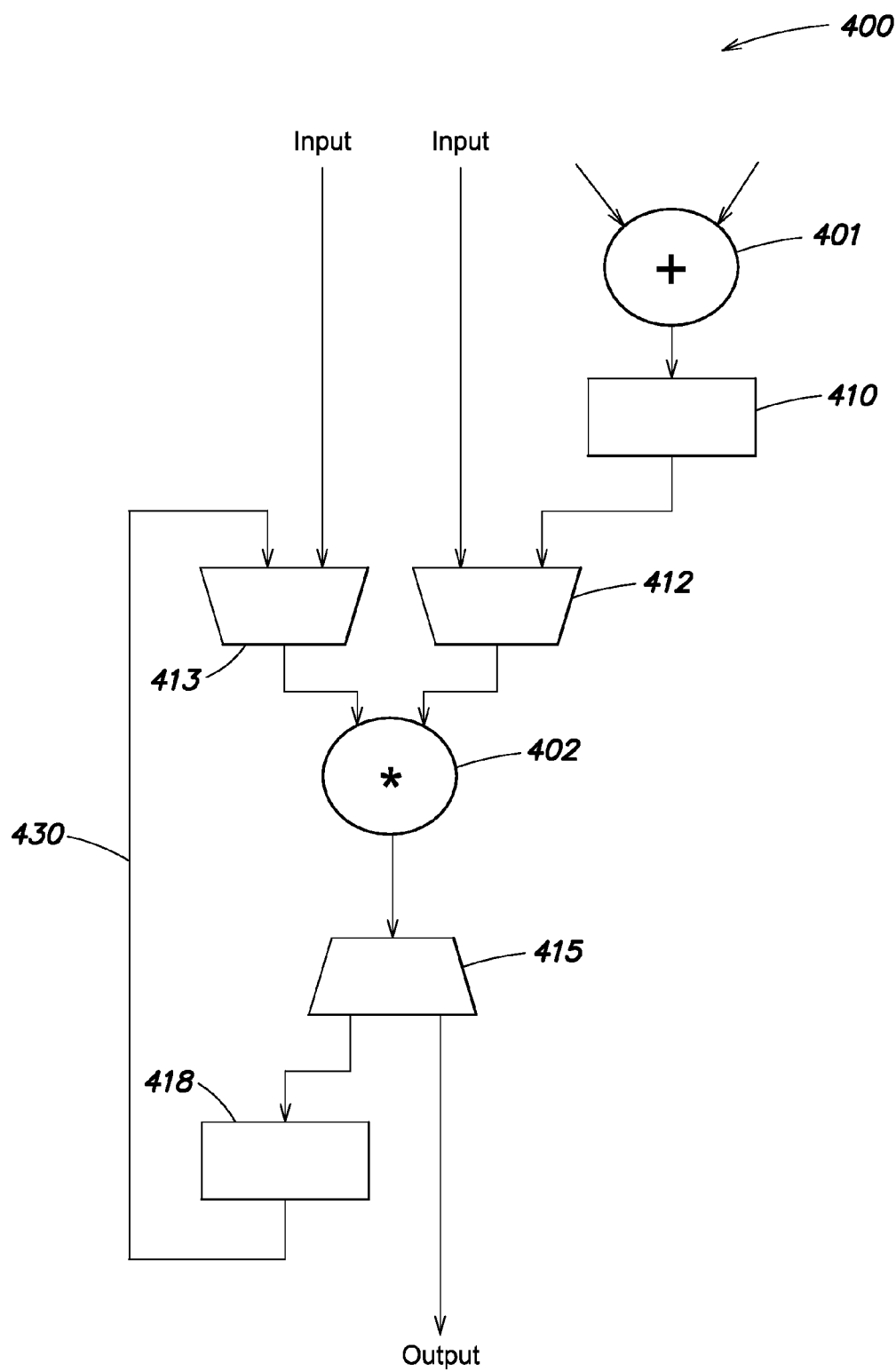
FIG. 4 is an example of a resulting implementation of the component when resource constraints are applied.

A graphical representation of the resulting implementation model 400 mapping nodes to resources may be as shown in FIG. 4. Here is seen the single adder 401 and single multiplier 402. Because the multiplier 402 is being reused, a feedback loop is also implemented.

This reuse of the multiplier has also introduced a resource dependency—that is, the output of the first multiply operation 301 needs to be made available as an input before the second multiply operation 303 in the original graph 300 can execute. To support this needed resource dependency, requiring reuse of the multiplier, requires the addition of timing elements such as registers and multiplexers.

Continuing to review FIG. 4, timing and data flow elements have also been added. As shown, the rectangular elements 410, 418 are registers, and the trapezoids 412, 413 are multiplexers. Trapezoid 415 is a demultiplexer. The multiplexers 412, 413 select one input or the other depending upon which time slot is presently active. A logic circuit or other controller 417 is also added to the model and provides logical signals to control the state of the multiplexers and for clocking the registers in the implementation model.

Although the list scheduling algorithm was discussed above, the resulting model code 400 of FIG. 4 could have been provided by scheduler 257 using any available scheduling algorithm. Thus in some instances, other techniques such as a force directed, or other scheduling algorithm could be used. Force directed algorithms can be used to minimize latency, but cannot be used to improve throughput. Consider that $$\text{throughput}=1/(\text{cycle-time}),$$

where cycle-time is the maximum number of delays/registers in any given cycle in the graph. This is because cycle-time is the time it takes for the design to reset itself to receive a new sample-set. Thus, maximizing throughput typically requires minimizing the cycle-time of the graph.

In some implementations, it may be desirable to not only minimize latency, but to also maximize throughput. For example, a more sophisticated scheduling algorithm may be implemented via scheduler 257, such as force directed scheduling, to find the throughput of an implementation graph, i.e., the cycle with the largest number of registers in the graph. However, some optimizing techniques are iterative and therefore require a large number of operations to complete. In one example, finding the cycle time may require a number of operations proportional to $O(n^3)$, where n is the number of nodes in the model. Thus in practice, they are often not used. For example, the user may instead merely designate the throughput to be the same as the schedule length (since it can never be longer). However this is a less than optimal scheduling solution.

IV. Extending the Cycle Time

Irrespective of how the implementation code 400 is initially generated or the initial scheduling 257 mechanism employed, optimizer 258 should also take into account how two or more components interact.

Figure 5:
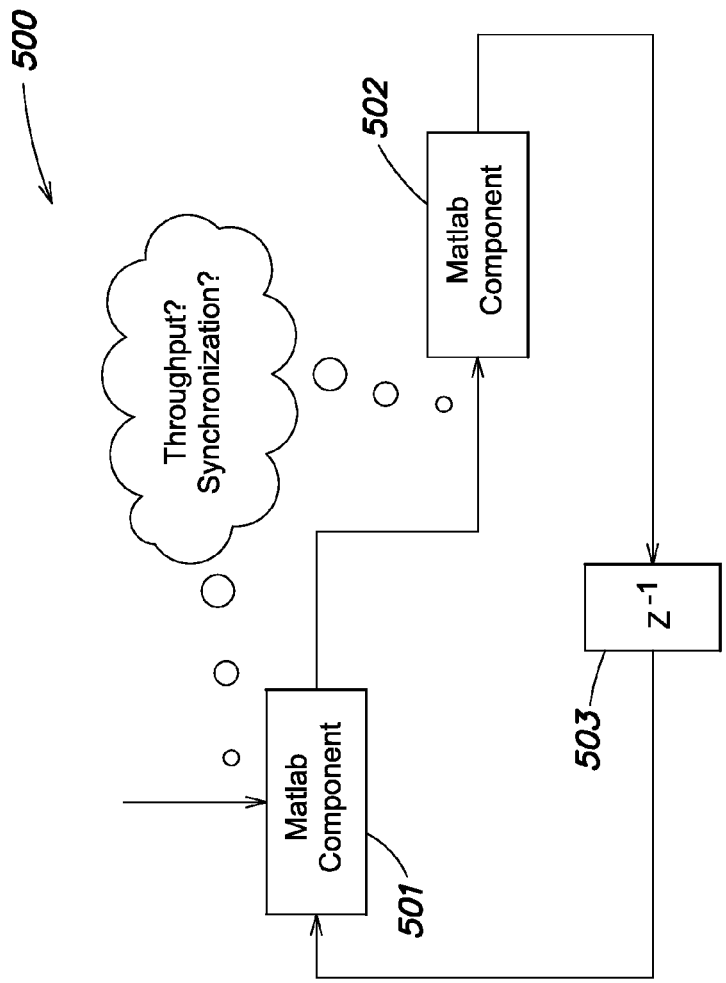
FIG. 5 illustrates a flow diagram for a system having two components interconnected in a loop.

FIG. 5 is a simplified example of how to take into account interaction between components. In this example, there are two components 501, 502, each having their own constrained resources. Components 501, 502 are also connected in a feedback loop via a delay component 503. In this implementation, the scheduler 257 has devised a schedule for the resources within component 501 such that its latency is 5 cycles long. In other words, component 501 requires 5 time slots for a change at the input to appear at the output. A simple solution uses only this latency factor in determining the schedule; that will guarantee that the output that component 501 provides to component 502 is always valid. This is known as a "schedule length constrained" schedule and represents the most conservative approach to inter-component design.

However, a better solution also considers how quickly one can initiate a new sample set to the input of component 501, in other words, also taking into account component 501's data processing throughput. Here the throughput of component 501 may be 3 cycles, for example.

Secondly, optimizer 258 should also consider how the scheduled components 501, 502 best interface with one another. In other words, how should the data input and output paths be controlled to ensure fastest possible execution time for the overall system?

Turning first to the question of throughput, improvements can be made over a schedule length constrained solution. For example, execution might be implemented in one or more pipelines. However, finding the largest cycle in a directed flow graph is not a trivial problem, generally representing a cubic complexity as mentioned above. As such, it is not a commonly used approach; most designers wish to have such analysis completed in linear time. As a result, because they are computationally complex, most designers do not use sophisticated optimization algorithms and simply stick to conservative scheduling algorithms here as well, such as a schedule length approach.

In a system-level design such that of FIG. 5, consider again the situation where component 501 has a resource occupied for 5 time cycles. Since that resource needs to be occupied for five cycles (or time slots), that is also the minimum throughput rate. The component 501 cannot start processing a new input in anything less than five time slots.

An example scheduling approach can provide a solution with linear complexity, assuming that the component 501 is a constrained resource. The main insight is that "cycles" in the resulting graph are created as a result of the need for scheduling a resource in multiple time slots. An improved scheduling method can be provided if the problem is stated, not as one of just finding the longest cycle in a graph, but rather considering what causes the cycles to be introduced in the first place. In particular, the scheduling method here finds the largest span of a shared resource in the execution schedule across all resources in a resource-constrained component.

More particularly, the scheduler 257 and/or optimizer 258 separately analyzes an initial schedule. The initial schedule can be provided by any convenient technique, such as ready list scheduling. The implementation then determines the earliest time slot and the latest time slot in which a constrained resource is scheduled to be busy. That is then considered to be the "cycle time" for that constrained resource. This analysis is then repeated for all resources in the component model.

The result is then one of determining the largest span in the schedule across all resources implemented for a component, rather than the longest delay in the more complicated directed flow graph for the entire system. This is a problem of only linear complexity, since all that needs to be done is to walk down a list of resources, and keep a list of the longest cycle time encountered. The scheduling process may start with the assumption that the original directed flow graph for a component does not itself have any cycles, and that any cycles in the initial schedule were created because of the allocation of resources across the different time slots.

Figure 6:
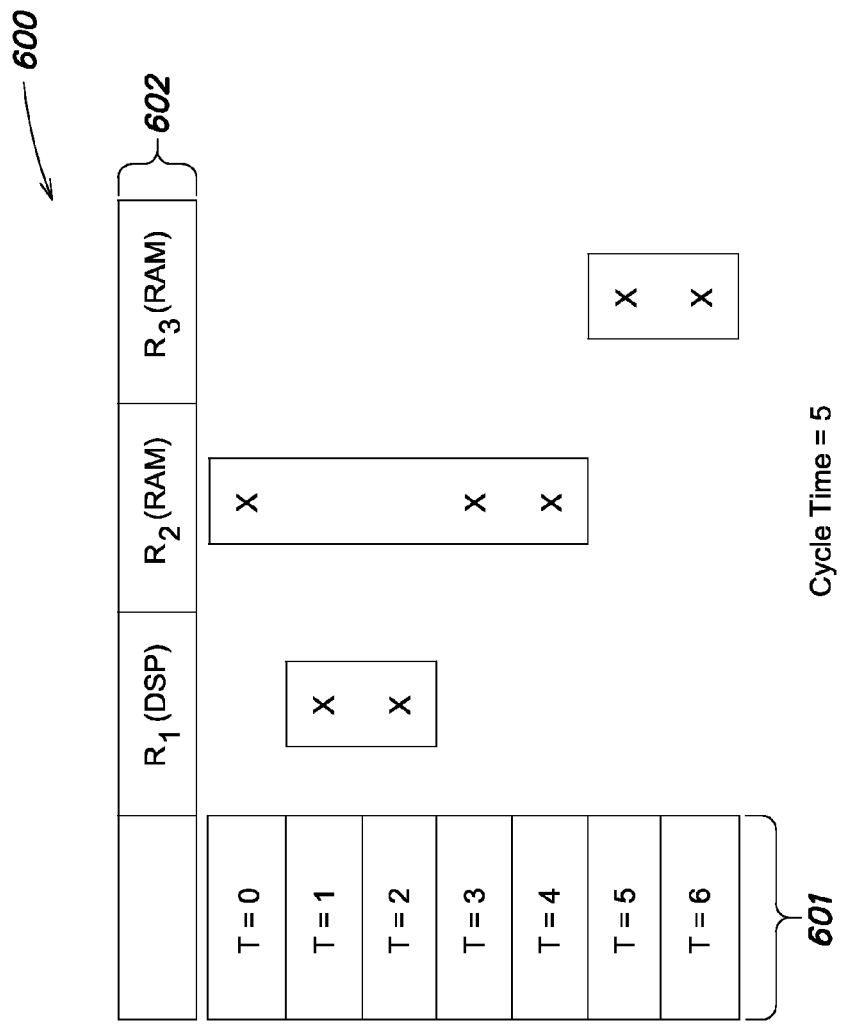
FIG. 6 is an example schedule for a resource-constrained component.

FIG. 6 is an example of an initial schedule table 600 that can be used. The table 600 results from executing some initial scheduling algorithm on the model 300, such as by a ready list algorithm in scheduler 257. In the schedule of table 600 there are seven (7) time slots represented by the seven rows 601 in the table, e.g., T=0, T=1, . . . , T=6. The schedule then repeats after T=6 (that is, once the last time slot T=6 is encountered, then T=0 is next executed again).

Each column 602 in the table represents a constrained resource used to implement the component 501. In this example there are three resources that make up the component 501, including a digital signal processor resource R1, a first Random Access Memory (RAM) resource R2, and a second RAM resource R3. An "X" in a cell of the table indicates that the resource is busy at the indicated time slot. The table 600 thus represents a map of resources to the available time slots.

The largest cycle time is then determined for each resource R1, R2, R3 by reading down its associated column in the table 600. For each column, the algorithm finds the earliest time slot in which there is an "X" and the latest time slot in which there is an "X". Any intervening empty cells indicate a "not busy" time slot, but these still factor into the determination of the span between first and last busy slot. That span, or difference between the first and last busy time slot becomes the cycle time for that resource. Thus, for resource R1 the cycle time is 2. For resource R3 the cycle time is also 2. But for resource R2 the cycle time is 5. The largest cycle time in the schedule across all resources used for implementing the component is thus 5 cycles (or time slots).

Figure 7:
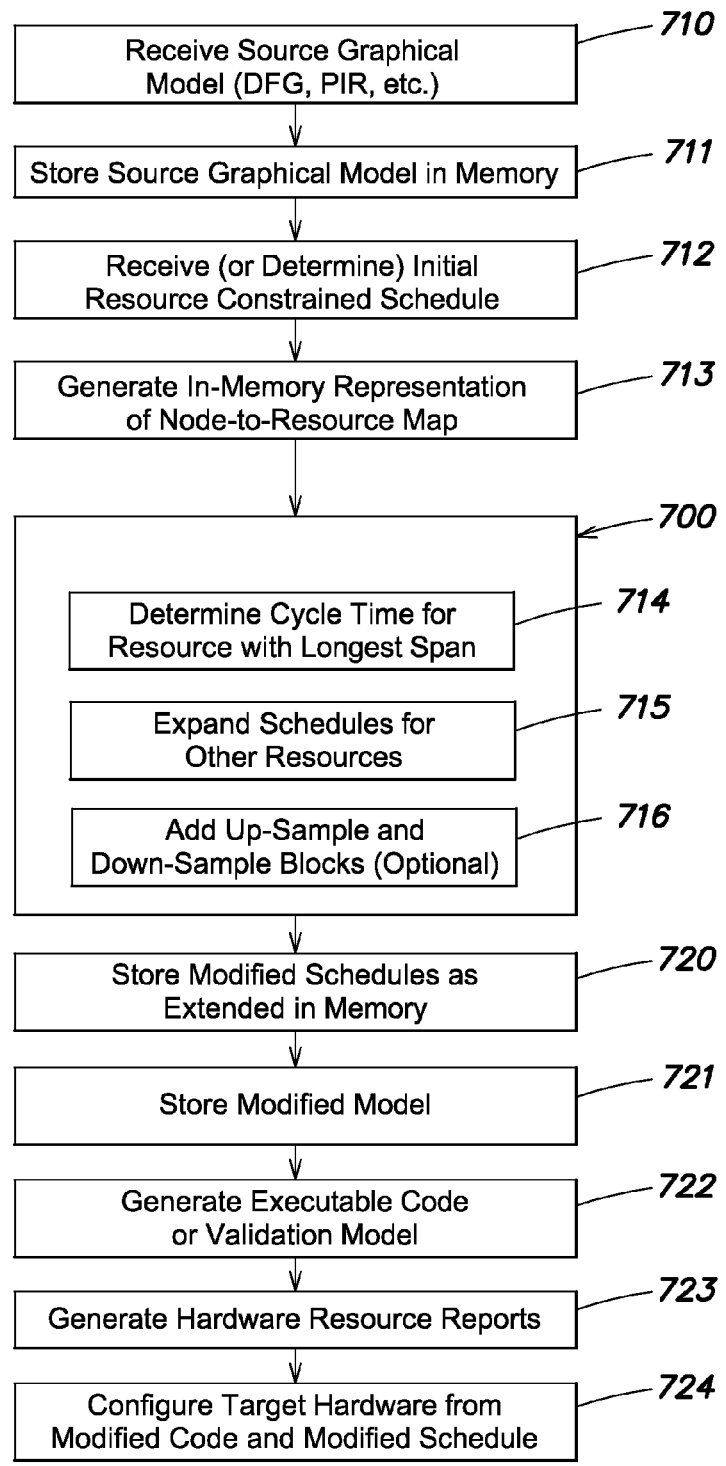
FIG. 7 is an example algorithm used by the code generation environment for implementing resource constrained scheduling.

FIG. 7 is a flow chart of a sequence of steps implemented in an embodiment of the scheduler 257 and/or optimizer 258 working together with the scheduler 257. In a first state 710, a source graphical model is received. The source graphical model may be in the form of a directed flow graph provided for a system such as that shown in FIG. 5 with details for each component such as shown in FIG. 3. In a next state 711 the source graphical model is stored in memory.

In a next state 712 an initial resource constrained schedule is either determined by the scheduler 257 or received from an external source. The resource constrained schedule, which may be derived from a ready list algorithm in scheduler 257 or elsewhere, is associated with a resulting implementation model 400 that provides a model of the resources and additional elements, such as that shown in FIG. 4. An in-memory representation of the node to resource map, such as that shown in FIG. 6 is also stored in state 713. It should be understood that the above discussion assumes that in-memory representation is created as part of the scheduler determining the initial resource constrained schedule; in other implementations, the in-memory representation may be created first, such as when it is received from an outside source. Thus steps 712 and 713 may occur in a different order than shown in FIG. 7.

Processing then follows in state 714 to determine the schedule extension. Referring to the example resource to time slot map (as may be determined per FIG. 4) a cycle time for the resource with the longest span is determined in state 714. Next the schedules for other resources in the component model are expanded in state 715. Optional step 716 will be described below.

In state 720 the modified schedule for the component is stored in a memory. In state 721 the modified model with modified schedule may then also be stored in memory.

In state 722 the executable code or validation model can then be generated. Additional steps such as generating hardware resource reports in state 723 and/or configuring target hardware from the executable code and schedule as in state 724 can be performed.

V. Synchronization Between Components

As mentioned previously, the second aspect of the improved scheduling of a design concerns synchronization between two or more components. Once the throughput of each component is known, the design must also consider how often each component can be invoked by applying a new input.

One common solution to this problem is to dispose an asynchronous interface between each of the scheduled components 501, 502. The asynchronous interface can be implemented for example by using a ready/valid protocol and adding enable signals to each component indicating when an output signal is valid and when it is ready to accept input.

However, there are other situations where the additional complexity of asynchronous interfaces is not desirable. Thus in situations where fully synchronous designs are needed, the scheduling approach here provides additional advantages through the application of local multirate sampling techniques. In a multirate approach as described herein, the number of data samples consumed and produced by a component 501, 502 can be different than one (1), such as where the component operates at different frequencies via the use of down-samplers and up-samplers. For example, a times 2 down-sampler (also sometimes called a "decimator") rejects every other data sample, thus producing one data output for every two data samples input. A times 2 up-sampler (also called an "interpolator") introduces an additional data output for every data sample input, thus producing two data outputs for every single data sample consumed.

Figure 8:
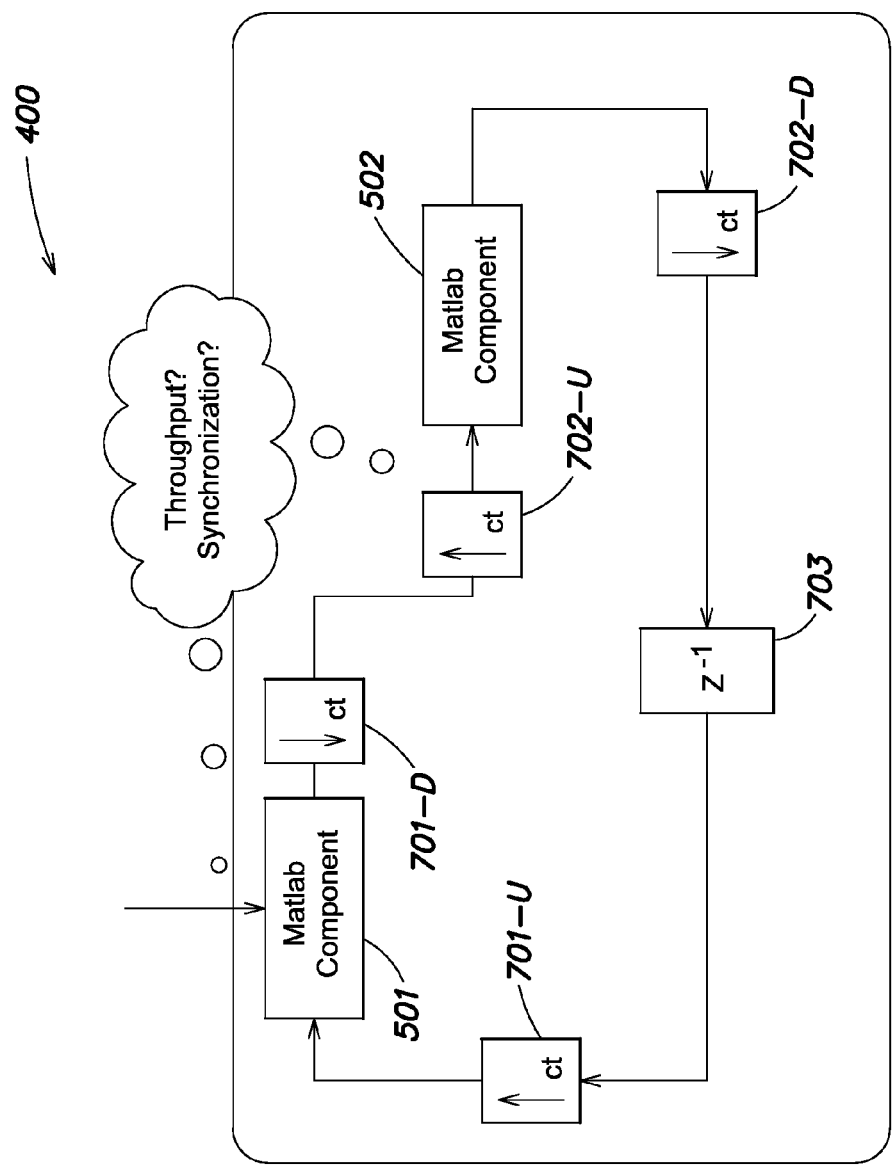
FIG. 8 is a more defined flow diagram of the system after local multi-rate elements are added.

FIG. 8 illustrates an example of how the optimizer 258 may, in optional step 716 of FIG. 7, modify the model 400 to accordingly implement local multi-rate sampling. Up-sampler 701-U and down-sampler 701-D functions are respectively inserted at the input and output of certain resource-constrained components 501, 502. The up-sample component 701-U associated with component 501 up-samples by the same amount as the component 501 cycle time, and the down-sample component 701-D down-samples by the same amount as the component 501 cycle time. The up-sampler and down-sampler components are inserted to the resulting system design as part of optimizing 258 the implementation of component 501.

The up-sampler 701-U and down-sampler 701-D create fast cycles in the associated component, so that the system design does not have to be further modified to accommodate synchronization. Communication between two components 501, 502 will always be valid. The cost is that each component must run a higher rate. For example, in the system described here where the cycle time for component 501 is 5 time slots, component 501 will have to process input data five times faster.

The down samplers 701-D, 702-D provide an aspect of synchronization as they discard the intermediate, potentially invalid outputs from each component. Because there is work being done during intermediate sample times, these outputs may represent values that are not valid. The down-samplers 701-D, 702-D automatically discards these invalid outputs.

It should also be understood that the local multi-rate optimization is component specific such that the up-sampler 701-U and down-sampler 701-D rates for component 501 be may be different than the up-sampler 702-U and down-sampler 702-D rates applied for another component 502.

The introduction of the up samplers 701-U, 702-U and down samplers 701-D, 702-D in step 716 of FIG. 7 introduces another complication to the overall system design. Returning attention to FIG. 5, resource R2 must be allowed to run for five time slots. However other resources such as R1 and R3 have shorter cycle times of only two time slots. This difference in allocation of resources may, in some example implementations, be accommodated, since failing to assign R1 and R3 to deterministic states during their idle times may lead to invalid outputs for the component as a whole.

One implememtation of this is to find a Least Common Multiple (LCM) of all the cycle times of a component, and extend the schedule to that many cycles. With that approach, all operational states for all of the resources are then valid. Extending the schedule to the LCM length ensures that after the schedule repeats to T=0, all the states are valid.

Figure 9:
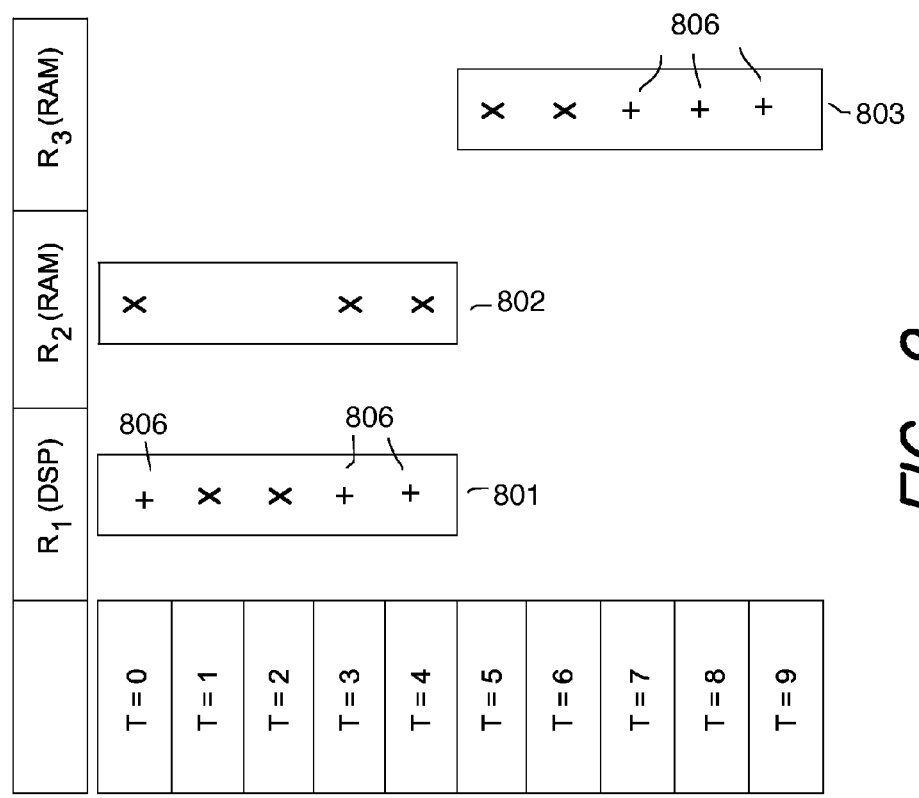
FIG. 9 is a revised schedule for the resource constrained component.

However, a better solution is possible in other implementations. For example, idle cycles may be introduced to each resource, so as to expand (or "extend") the schedule for each resource. In particular, the schedule for each resource may be extended as shown in FIG. 9. Here, resource R1 has an initial schedule 801, resource R2 has initial schedule 802, and resource R3 has initial schedule 803. As per the analysis of FIG. 6, R2 is determined to be the schedule with the largest cycle time. Thus R1 and R3 are extended with idle cycles 806 as indicated by the "+" in the schedules. Note that the schedule extention is such that the schedule for each resource R1, R2, R3 now has the same total cycle time (5 cycles) as the other resources in the component.

One further condition in this implementation is that the resources assigned to R1 and R3 should be controllable so as to actually be idle during the idle cycle times 806 such that they do not introduce any unpredictable (indeterminant)

states or outputs. Note also that the total schedule length has now been extended to 10 time slots as compared to FIG. 6.

VI. Limiting to Strongly Connected Components

In another implementation, only the components of the model that meet a Strongly Connected Components (SCC) criteria are subjected to the rescheduling and multi-rate synchronization described above. While the strongly connected components (SCCs) can be any component in the model, in example implementations they are limited to being that set of nodes such that each node in the set is reachable from every other node in that set. The SCCs are essentially feedback loops in the graph and the SCCs are that set of nodes constituting the loop. There are well-known methods for finding SCCs given a data flow graph. One such method is known as Tarjan's algorithm, although other methods to find the SCCs may be used in example implementations.

In the present situation, only the SCCs created by shared resource usage are of interest. Referring back to the example of FIG. 5, if components 501 and 502 are determined to be SCCs as a result of sharing some resource, then the schedules for these components are adjusted to the maximum schedule for each such SCC. Referring back now to the example of FIG. 8, up-samplers 701-U, 702-U and down-samplers 701-D, 702-D are only inserted before and after the SCCs 501, 502 and not before or after other components. By only implementing the up- and down samplers for the SCCs, the overall system is provided with better throughput.

Figure 10:
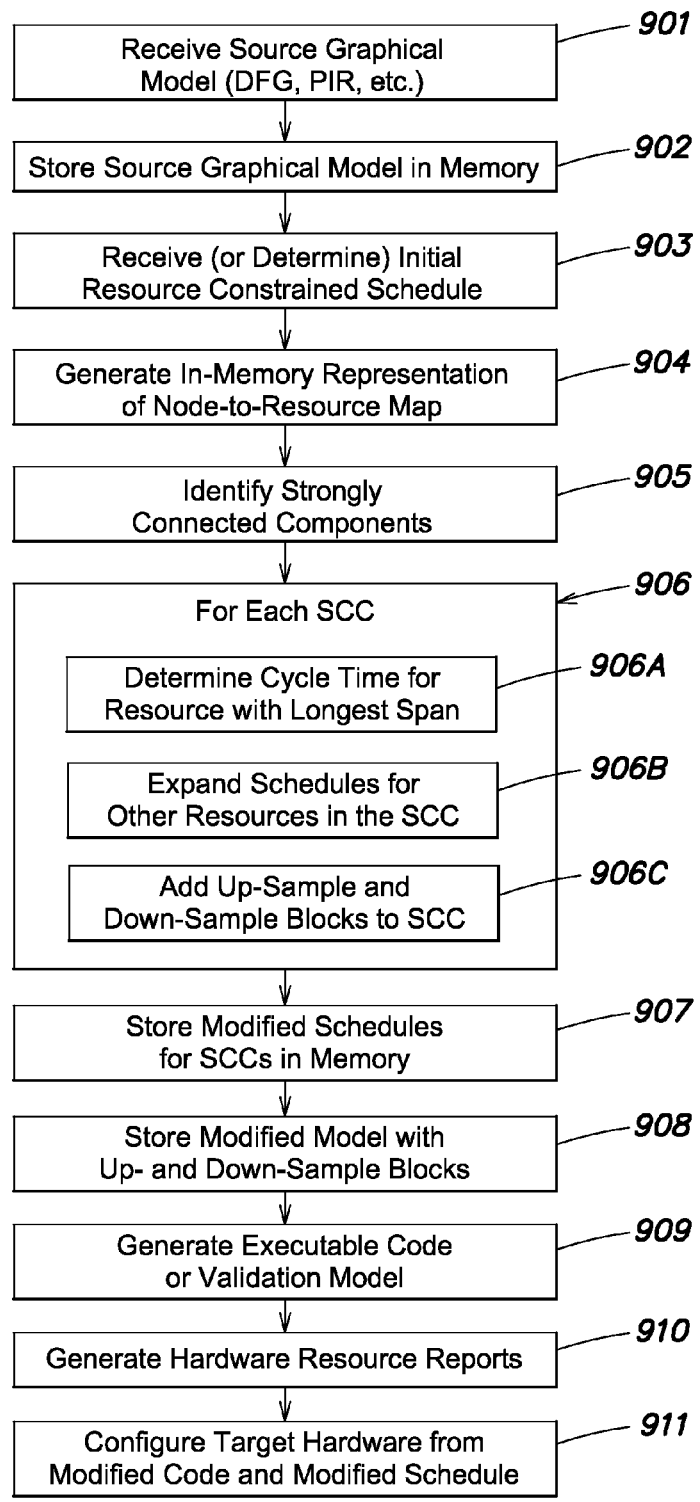
FIG. 10 is an example algorithm used by the code generation environment for implementing resource constrained scheduling only for strongly connected components.

FIG. 10 is a flow chart of a sequence of steps implemented in an embodiment of the scheduler 257 and/or optimizer 258 working together with the scheduler 257. As with the flow of FIG. 7, in a first state 901, a source graphical model is received. The source graphical model may be in the form of a directed flow graph provided for a system such as that shown in FIG. 5. In a next state 902 the source graphical model is stored in memory.

In a next state 903 an initial resource constrained schedule is either determined by the scheduler 257 or received from an external source. The resource constrained schedule, which may be derived from a ready list algorithm in scheduler 257 or elsewhere, is associated with a resulting implementation model 400 that provides a model of the resources and additional elements, such as that shown in FIG. 4. An in-memory representation of the resource map, such as that shown in FIG. 6, is also stored in state 904. It should be understood that the above discussion assumes that in-memory representation is created as part of the scheduler determining the initial resource constrained schedule; in other implementations, the in-memory representation may be created first, such as when it is received from an outside source. Thus steps 903 and 904 may occur in a different order than shown in FIG. 10.

Any strongly connected components (SCCs) are then determined in state 905 from among all components in the system model.

For each such SCC, the optimizer proceeds in state 906 as was described in connection with FIGS. 6 and 7. A cycle time for the resource with the longest span is determined in state 906A. Next the schedules for other resources in the SCC are extended in state 906B as was described in connection with FIG. 9. Finally up-sampler and down-sampler blocks are inserted in state 906C before and after the SCCs, as was described in connection with FIG. 8.

In state 907 the modified schedules for the SCCs are stored in a memory. In state 908 the modified model with the inserted up-and-down sampler blocks is then stored in memory.

In state 909 the HDL code representation of the circuit, or Intermediate Representation (IR) of a software program as executable code using the revised model and revised schedule can be generated. Other available functions of the development environment (e.g., the MATLAB, SIMULINK, LabVIEW, VEE, Khoros, Modelica, SCADE, or other development systems) may then be accessed that further utilize the revised model and schedule. For example, the development environment may generate resource utilization reports for an HDL model (as in state 910) or target hardware may be configured (as per state 911).

VII. Further Considerations

As described herein, embodiments of the system and method apply functional equivalence as a primary constraint in implementing a high-level design specification. When these functional equivalence constraints are met are further optimizations, such as retiming, are applied.

While what has been described as an example is a way to generate an HDL description to be implemented in hardware such as a field programmable gate array or application specific integrated circuit, it should be understood that the same techniques can be used to generate other things, such as program code (such as C code) to be executed on a programmable processor, from a high level description.

Alternative embodiments may use various techniques to split a program for execution on multi-core processors or to create a multi-threaded process or program from a single-threaded process or program.

The foregoing description has been directed to specific embodiments. It will be apparent, however, that other variations and modifications may be made to the described embodiments, with the attainment of some or all of their advantages. Therefore, it is the object of the appended claims to cover all such variations and modifications as come within the true spirit and scope of this patent.

What is claimed is:
1. A method comprising:
building, using a computer, an in-memory representation of an execution schedule for at least one component in a system model, the system model represented as a graph including nodes and connections between the nodes,
the execution schedule specifying time slots and assignment of one or more nodes in the graph to resources within one or more of the time slots, and
the execution schedule being resource-constrained such that one or more of the resources is a constrained resource that is assigned to two different nodes in the graph at two different respective time slots, the time slots including at least a respective initial busy time slot and a respective latest busy time slot;
examining the execution schedule, using the computer, the examining:
identifying one of the constrained resources, among the one or more constrained resources, having a longest span between the respective initial busy time slot and the respective latest busy time slot, and
determining an extended cycle time based on the identified longest span between the respective initial busy time slot and the respective latest busy time slot;

modifying the execution schedule, using the computer; and producing, based on the modifying, an extended execution schedule by extending the execution schedule for one of the resources other than the identified constrained resource, the extended execution schedule being extended to at least the extended cycle time.

2. The method of claim 1 additionally comprising:
generating a Hardware Description Language (HDL) code implementation of the system model using the extended execution schedule.

3. The method of claim 1 wherein examining the execution schedule further comprises:
for each resource included in the execution schedule, determining a respective span between the respective initial busy time slot and the respective latest busy time slot; and comparing respective spans for each resource to determine a resource corresponding to the longest span among all resources in the execution schedule, to determine the extended cycle time.

4. The method of claim 3 wherein there is at least one idle time slot between the respective initial busy time slot and the respective latest busy time slot for at least one resource in the extended execution schedule.

5. The method of claim 1 wherein the step of examining the execution schedule is performed for one or more constrained resources that are Strongly Connected Components (SCCs) of the system model.

6. The method of claim 1 wherein the step of modifying the execution schedule is performed for one or more constrained resources that are Strongly Connected Components (SCCs) of the system model.

7. The method of claim 1 wherein
examining the execution schedule further determines a cycle time for two constrained resources to determine a first extended cycle time and a second extended cycle time; and modifying the execution schedule extends the execution schedule for the different resource by a Least Common Multiple (LCM) of the first extended cycle time and the second extended cycle time.

8. The method of claim 1 further comprising:
synchronizing input and output interfaces to the at least one component by modifying the system model to include multi-rate sampling components.

9. The method of claim 8 wherein synchronizing further comprises:
inserting a up-sampler before an input of the at least one component in the system model, to increase a sample rate by a factor determined by the extended cycle time.

10. The method of claim 8 wherein synchronizing further comprises:
inserting a down-sampler after the output of the at least one component in the system model, to decrease a sample rate by a factor determined by the extended cycle time.

11. The method of claim 1 further comprising:
replacing a least one resource with a resource that has an idle operation mode.

12. A method for generating code specifying attributes of resources available to implement a system model, the system model including two or more components, and the method comprising:
receiving, within a computer system, an Intermediate Representation (IR) model including a resource-constrained execution schedule for a plurality of the two or more components, the resource-constrained execution schedule including a plurality of time slots, and the resource-constrained execution schedule assigning available resources to the two or more components of the system model, such that at least one resource is assigned to two or more time slots, the two or more time slots including at least an initial busy time slot and a latest busy time slot;

determining which of the components in the model are Strongly Connected Components (SCCs);

for SCCs in the model, examining the resource-constrained execution schedule within the computer system, the examining comprising:
determining which resource assigned to the SCCs has a largest cycle time between its corresponding initial busy time slot in the schedule and its corresponding latest busy time slot in the schedule, extending a cycle time of at least one other resource by enabling an idle mode for the at least one other resource during unassigned time slots for the at least one other resource, inserting an up-sampler before an input to at least one resource in the model, a rate of the up-sampler being the largest cycle time, inserting a down-sampler after an output from at least one resource in the model, a rate of the down-sampler being the largest cycle time, and generating code from the system model.

13. An apparatus comprising:
an interface for:
receiving an Intermediate Representation (IR) that includes a functional model, the functional model including representations of at least two components and interconnections between the at least two components;

a memory, for storing the IR; and a processor, for executing program code to implement a schedule optimizer, the program code for:
accessing the memory to read the IR of the functional model, examining an execution schedule for at least one component in the functional model, the execution schedule for the component having at least an initial busy time slot and a latest busy time slot, determining which of several constrained resources implementing the at least one component has a longest span time between a respective initial busy time slot and a respective latest busy time slot, and assigning an extended execution schedule using the longest span time for a different resource implementing the at least one component.

14. The apparatus of claim 13 wherein the processor is further for:
generating a Hardware Description Language (HDL) code implementation of the system model using the extended execution schedule.

15. The apparatus of claim 13 wherein the processor is further for examining an execution schedule by:
for each constrained resource,
determining a span between the initial busy time slot and the latest busy time slot; and comparing spans for at least two constrained resources to determine a constrained resource corresponding to the longest span time.

16. The apparatus of claim 15 wherein there is at least one idle time slot between the initial busy time slot and the latest busy time slot for at least one constrained resource.

17. The apparatus of claim 13 wherein the program code is further for examining the execution schedule only for Strongly Connected Components (SCCs).

18. The apparatus of claim 13 wherein the program code is further for assigning the extended execution schedule only for Strongly Connected Components (SCCs).

19. The apparatus of claim 13 wherein the program code is further for examining the execution schedule by:
   determining a cycle time for two constrained resources to determine a first and second cycle time; and
   assigning the extended execution schedule for the different resource by a Least Common Multiple (LCM) of the first and second cycle time.

20. The apparatus of claim 13 wherein the program code is further for:
   synchronizing input and output interfaces to the component by modifying the IR to include local multi-rate sampling components.

21. The method of claim 20 wherein the program code is further for synchronizing by:
   inserting a up-sampler before the input of the component in the system model, to increase the sample rate by a factor determined by the longest span time.

22. The apparatus of claim 20 wherein the program code is further for synchronizing by:
   inserting a down-sampler after the output of the component in the system model, to decrease the sample rate by a factor determined by the longest span time.

23. The apparatus of claim 13 wherein the program code is further for:
   replacing a least one resource in the IR with a resource that has an idle operation mode.

24. One or more non-transitory computer readable media comprising instructions executable by a computer, the media comprising:
   instructions to build an intermediate representation (IR) of a functional specification, the IR having a plurality components and a plurality of interconnections between the components;
   instructions to store the IR in a memory;
   instructions to optimize a schedule by:
      accessing the memory to read the IR of the functional model;
      determining, for at least one component in the functional model, which of several constrained resources implementing the at least one component has a longest span time between an initial busy time slot and a latest busy time slot; and
      extending the execution schedule for other resources implementing the component to the longest span time.

25. The one or more non-transitory computer-readable media of claim 24 wherein the instructions are further for:
   generating a Hardware Description Language (HDL) code implementation of the system model using the extended execution schedule.

26. The one or more non-transitory computer-readable media of claim 24 wherein the instructions are further for extending the execution schedule only for Strongly Connected Components (SCCs).

27. The one or more non-transitory computer-readable media of claim 24 wherein the instructions are further for examining the execution schedule by:
   determining a cycle time for two constrained resources to determine a first and second cycle time; and
   assigning the extended execution schedule for the other resources by a Least Common Multiple (LCM) of the first and second cycle time.

28. The one or more non-transitory computer-readable media of claim 24 wherein the instructions are further for synchronizing by:
   inserting a up-sampler before the input of the at least one component in the system model, to increase the sample rate by a factor determined by the longest span time; and
   inserting a down-sampler after the output of the at least one component in the system model, to decrease the sample rate by a factor determined by the longest span time.

* * * * *

UNITED STATES PATENT AND TRADEMARK OFFICE
CERTIFICATE OF CORRECTION

PATENT NO. : 9,740,529 B1  
APPLICATION NO. : 14/560509  
DATED : August 22, 2017  
INVENTOR(S) : Chun-Yu Shei et al.

Page 1 of 1

It is certified that error appears in the above-identified patent and that said Letters Patent is hereby corrected as shown below:

On the Title Page

(71) Applicant reads:  
"The Mathworks, Inc., Natick, MA (US)"  
Should read:  
--The MathWorks, Inc., Natick, MA (US)--

In the Specification

Column 6, Line 19 reads:  
"nodes of the PR, also known as components, represent"  
Should read:  
--nodes of the PIR, also known as components, represent--

Column 6, Line 29 reads:  
"PR."  
Should read:  
--PIR.--

Signed and Sealed this  
Twenty-fourth Day of September, 2019

Andrei Iancu  
*Director of the United States Patent and Trademark Office*